United States Patent
Shibata

(10) Patent No.: US 8,809,869 B2
(45) Date of Patent: Aug. 19, 2014

(54) DIODE WITH HETEROJUNCTION OF NITRIDE SEMICONDUCTOR LAYERS

(71) Applicant: Panasonic Corporation, Osaka (JP)

(72) Inventor: Daisuke Shibata, Toyama (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/721,943

(22) Filed: Dec. 20, 2012

(65) Prior Publication Data

US 2013/0105815 A1 May 2, 2013

Related U.S. Application Data

(63) Continuation of application No. PCT/JP2011/002349, filed on Apr. 22, 2011.

(30) Foreign Application Priority Data

Jul. 16, 2010 (JP) ................. 2010-161402

(51) Int. Cl.
*H01L 29/20* (2006.01)
*H01L 29/45* (2006.01)
*H01L 29/861* (2006.01)
*H01L 29/417* (2006.01)

(52) U.S. Cl.
CPC .......... *H01L 29/2003* (2013.01); *H01L 29/452* (2013.01); *H01L 29/861* (2013.01); *H01L 29/417* (2013.01)
USPC .......................................................... 257/76

(58) Field of Classification Search
CPC ... H01L 29/20; H01L 29/2003; H01L 29/861; H01L 29/452; H01L 29/417
USPC .......................................................... 257/76
See application file for complete search history.

(56) References Cited

U.S. PATENT DOCUMENTS

2005/0110042 A1  5/2005 Saito et al.
2005/0194612 A1  9/2005 Beach
(Continued)

FOREIGN PATENT DOCUMENTS

JP  2005-317843 A  11/2005
JP  2008-166640 A   7/2008

OTHER PUBLICATIONS

Ishida, H.; Shibata, D.; Yanagihara, M.; Uemoto, Y.; Matsuo, H.; Ueda, T.; Tanaka, T.; Ueda, D., "Unlimited High Breakdown Voltage by Natural Super Junction of Polarized Semiconductor," Electron Device Letters, IEEE , vol. 29, No. 10, pp. 1087,1089, Oct. 2008.*

(Continued)

*Primary Examiner* — Walter H Swanson
(74) *Attorney, Agent, or Firm* — McDermott Will & Emery LLP

(57) ABSTRACT

A diode includes: a semiconductor layer stack; cathode and anode electrodes formed on the semiconductor layer stack so as to be spaced apart from each other; and a protection film covering a region of an upper surface of the semiconductor layer stack. The semiconductor layer stack includes a first nitride semiconductor layer, and a second nitride semiconductor layer having a larger band gap than the first nitride semiconductor layer, and has a channel. The anode electrode includes: a p-type third nitride semiconductor layer formed on the semiconductor layer stack; a first metal layer being in ohmic contact with the third nitride semiconductor layer; and a second metal layer being in contact with the first metal layer, and being in ohmic contact with the channel.

14 Claims, 4 Drawing Sheets

(56) References Cited

U.S. PATENT DOCUMENTS

| | | | |
|---|---|---|---|
| 2006/0108659 A1* | 5/2006 | Yanagihara et al. | 257/471 |
| 2006/0197175 A1* | 9/2006 | Yanagihara et al. | 257/472 |
| 2007/0210335 A1 | 9/2007 | Ikeda et al. | |
| 2008/0105902 A1 | 5/2008 | Twynam | |
| 2009/0050936 A1* | 2/2009 | Oka | 257/192 |
| 2009/0206371 A1 | 8/2009 | Oka | |
| 2010/0078683 A1 | 4/2010 | Baba et al. | |
| 2011/0227132 A1 | 9/2011 | Anda et al. | |

OTHER PUBLICATIONS

International Search Report issued in International Patent Application No. PCT/JP2011/002349 dated Aug. 2, 2011.

* cited by examiner

DIODE WITH HETEROJUNCTION OF NITRIDE SEMICONDUCTOR LAYERS

CROSS-REFERENCE TO RELATED APPLICATIONS

This is a continuation of International Application No. PCT/JP2011/002349 filed on Apr. 22, 2011, which claims priority to Japanese Patent Application No. 2010-161402 filed on Jul. 16, 2010. The disclosures of these applications including the specifications, the drawings, and the claims are hereby incorporated by reference in their entirety.

BACKGROUND

The present disclosure relates to diodes using a nitride semiconductor, and more particularly relates to a diode which can be used as a power device for use in, e.g., a power supply circuit.

Nitride semiconductors represented by gallium nitride (GaN) are wide gap semiconductors, and for example, the band gaps of GaN and aluminum nitride (AlN) at room temperature are 3.4 eV, and 6.2 eV, respectively. The nitride semiconductors have a high breakdown field, and a higher saturated electron drift velocity than compound semiconductors, such as gallium arsenide (GaAs), and silicon (Si) semiconductors, etc. In an AlGaN/GaN heterostructure of aluminum gallium nitride (AlGaN) and GaN on plane (0001), 2-dimensional electron gas (2DEG) is generated at the heterointerface due to spontaneous polarization and piezoelectric polarization. The sheet carrier concentration of 2DEG is $1\times10^{13}$ cm$^{-2}$ or higher without impurity doping, and a diode and a hetero junction field effect transistor (HFET) both having high current density can be achieved by utilizing 2DEG. Thus, power devices using nitride semiconductors which are advantageous in increasing output power and breakdown voltage have been actively researched and developed. Examples of diodes used as power devices include Schottky diodes. Schottky diodes using an AlGaN/GaN heterostructure have been developed as GaN-based diodes. Since a Schottky diode using an AlGaN/GaN heterostructure uses, as a channel, 2DEG generated at the interface between an undoped AlGaN layer and an undoped GaN layer, such a Schottky diode has low resistance, and can be operated at large current.

Generally, while Schottky diodes advantageously have excellent switching performance, they disadvantageously have large reverse leakage current. In order to reduce the reverse leakage current of a Schottky diode, the following method has been suggested (see, for example, Japanese Patent Publication No. 2005-317843). Two types of metals having different Schottky barrier heights are used as materials of an anode electrode, and one of the metals having a lower Schottky barrier height is covered with the other metal having a higher Schottky barrier height. With such a configuration, when the diode is forwardly biased, current flows through the metal having a lower Schottky barrier height, and thus, a low threshold voltage can be maintained, resulting in a reduction in the conduction loss of the diode. When the diode is reversely biased, the diode can be turned off by the metal having a higher Schottky barrier height, and thus, there is an expectation that the reverse leakage current could be reduced.

SUMMARY

However, the inventor of this application found a problem where, when a passivation film is formed, the above method cannot sufficiently reduce reverse leakage current. In a Schottky diode using an AlGaN/GaN heterostructure, in order to prevent impurities from entering a device, a passivation film is formed to cover the surface of the device. The passivation film reduces the formation of surface states, and also reduces the phenomenon which is called current collapse, and where forward current is reduced. A Schottky diode using an AlGaN/GaN heterostructure practically requires a passivation film. However, the inventor of this application found that the formation of the passivation film significantly increases the reverse leakage current of the diode. The reason why the reverse leakage current of the diode increases is that a leakage path is formed at the interface between the passivation film and an undoped AlGaN layer. Even when an anode electrode using two types of metals is used, the reverse leakage current caused by the passivation film cannot be sufficiently reduced. The threshold voltage of the diode needs to be further reduced to reduce conduction loss; however, the metal having a lower Schottky barrier height also forms a Schottky barrier, and thus, there is a limit on the extent to which the forward threshold voltage is reduced.

An object of the present disclosure is to solve the problems, and achieve a diode made of a nitride semiconductor, and implementing a sufficiently reduced reverse leakage current even with the formation of a passivation film.

In order to achieve the above object, in the present disclosure, a diode includes an anode electrode including a p-type nitride semiconductor layer, a first metal layer being in ohmic contact with the p-type nitride semiconductor layer, and a second metal layer connected to the first metal layer, and being in ohmic contact with a channel.

Specifically, an example diode includes: a semiconductor layer stack including a first nitride semiconductor layer formed on a principal surface of a substrate, and a second nitride semiconductor layer which is formed on the first nitride semiconductor layer, and has a larger band gap than the first nitride semiconductor layer, and having a channel through which electrons travel in a direction parallel to the principal surface of the substrate; cathode and anode electrodes formed on the semiconductor layer stack so as to be spaced apart from each other; and a protection film covering a region of an upper surface of the semiconductor layer stack between the cathode and anode electrodes. The anode electrode includes: a p-type third nitride semiconductor layer formed on the semiconductor layer stack; a first metal layer formed on the third nitride semiconductor layer, and being in ohmic contact with the third nitride semiconductor layer; and a second metal layer being in contact with the first metal layer, being opposite to the cathode electrode with respect to the third nitride semiconductor layer, and being in ohmic contact with the channel.

The example diode includes the anode electrode including: the p-type third nitride semiconductor layer formed on the semiconductor layer stack; the first metal layer formed on the third nitride semiconductor layer, and being in ohmic contact with the third nitride semiconductor layer; and the second metal layer being in contact with the first metal layer, being opposite to the cathode electrode with respect to the third nitride semiconductor layer, and being in ohmic contact with the channel. Thus, when the diode is forwardly biased, the second metal layer being in ohmic contact with the channel can provide very low on-resistance. When the diode is reversely biased, the current flowing from the cathode electrode to the anode electrode can be interrupted by a depletion layer extending from the third nitride semiconductor layer. A leakage path formed at the interface between the protection film and the semiconductor layer stack can be also interrupted by the third nitride semiconductor layer, and thus, the reverse leakage current can be reduced to a low level even with the formation of the passivation film. Furthermore, the forward threshold voltage can be adjusted by adjusting the distance between the third nitride semiconductor layer and the channel.

In the example diode, the first nitride semiconductor layer may include a plurality of first nitride semiconductor layers, the second nitride semiconductor layer may include a plurality of second nitride semiconductor layers, and the first nitride semiconductor layers and the second nitride semiconductor layers may be alternately formed.

In this case, the semiconductor layer stack may have a recess which does not reach an interface between a lowest one of the first nitride semiconductor layers, and a lowest one of the second nitride semiconductor layers, and the third nitride semiconductor layer may be formed to fill the recess.

Furthermore, the recess may reach the lowest second nitride semiconductor layer.

In the example diode, the semiconductor layer stack may have an anode recess passing through the second nitride semiconductor layer, and extending below an interface between the first and second nitride semiconductor layers, and the second metal layer may be in direct contact with the channel.

In this case, a location at which the second metal layer is in contact with the channel may be substantially aligned with a location of an end of the third nitride semiconductor layer opposite to the cathode electrode.

In the example diode, the second nitride semiconductor layer may have a recess which does not reach the first nitride semiconductor layer, and the third nitride semiconductor layer may be formed to fill the recess.

In the example diode, the third nitride semiconductor layer may be made of $Al_xGa_{1-x}N$, where $0 \leq x < 1$.

In the example diode, the first metal layer may be made of a material containing nickel or palladium, and the second metal layer may be made of a material containing aluminum or titanium.

The present disclosure can provide a diode which implements a sufficiently reduced reverse leakage current even with the formation of a passivation film.

DETAILED DESCRIPTION $Al_xGa_{1-x}N$ (where $0 \leq x \leq 1$) which is a ternary compound is abbreviated hereinafter as AlGaN. Other multi-element compounds are also abbreviated by arranging symbols of constituent elements, e.g., as AlInN or GaInN. For example, $Al_xGa_{1-x-y}In_yN$ (where $0 \leq x \leq 1$, $0 \leq y \leq 1$, and $0 \leq x+y \leq 1$) is abbreviated as AlGaInN.

The term "undoped" herein means that no impurity has been introduced intentionally. For example, undoped AlGaN is abbreviated as i-AlGaN.

Figure 1:
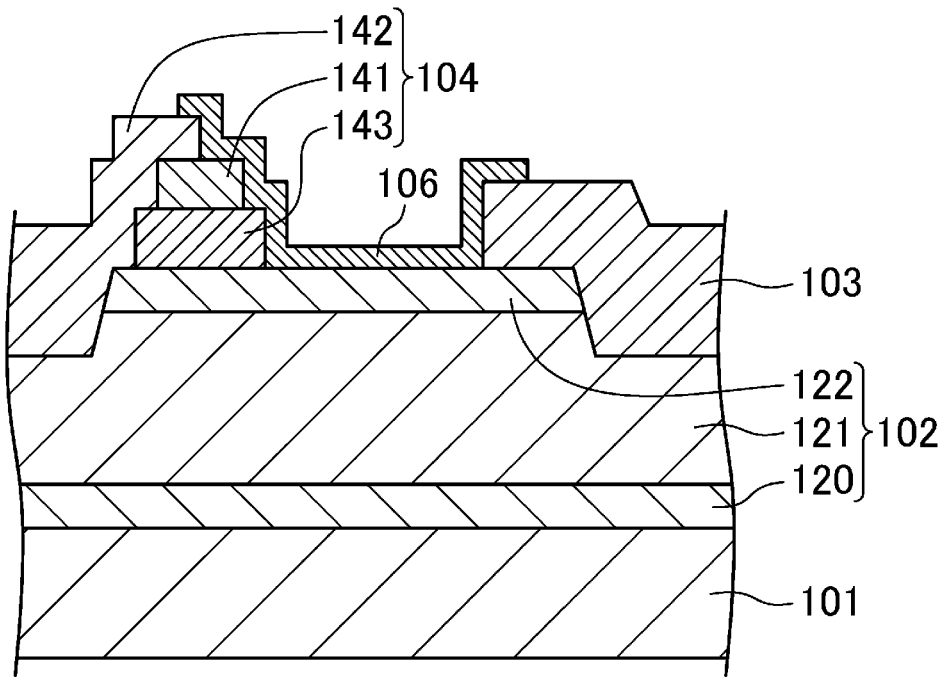
FIG. 1 is a cross-sectional view illustrating a diode according to an embodiment.

FIG. 1 illustrates a cross-sectional configuration of a diode using a nitride semiconductor according to an embodiment. As illustrated in FIG. 1, the diode of this embodiment includes a semiconductor layer stack 102 formed on a substrate 101. The substrate 101 may be, e.g., a Si substrate, a sapphire substrate, a silicon carbide (SiC) substrate, or a GaN substrate. The semiconductor layer stack 102 may include a 2-μm-thick buffer layer 120, a 3-μm-thick first nitride semiconductor layer 121 made of i-GaN, and a 25-nm-thick second nitride semiconductor layer 122 made of $i-Al_{0.25}Ga_{0.75}N$ which are sequentially formed. A channel made of 2DEG is formed in a portion of the first nitride semiconductor layer 121 in the vicinity of the interface between the first and second nitride semiconductor layers 121 and 122.

A cathode electrode 103 and an anode electrode 104 are formed on the semiconductor layer stack 102 so as to be spaced apart from each other. A portion of the semiconductor layer stack 102 between the cathode and anode electrodes 103 and 104 is covered with a protection film (passivation film) 106 made of, e.g., silicon nitride (SiN).

The cathode electrode 103 is formed in a cathode recess extending below the interface between the first and second nitride semiconductor layers 121 and 122, and is in ohmic contact with the channel. The cathode electrode 103 may be made of a material which is easily in ohmic contact with 2DEG, i.e., a material containing, e.g., titanium (Ti) or aluminum (Al), and may be made of, e.g., an alloy of Ti and Al.

The anode electrode 104 includes a third nitride semiconductor layer 143 selectively formed on the second nitride semiconductor layer 122, a first metal layer 141 formed on the third nitride semiconductor layer 143, and a second metal layer 142 being in contact with the first metal layer 141. The third nitride semiconductor layer 143 may be, e.g., a p-AlGaN layer having a carrier concentration of about $1 \times 10^{18}$ $cm^{-3}$. The first metal layer 141 may be made of a material which is in ohmic contact with the p-type third nitride semiconductor layer 143, i.e., a material containing, e.g., nickel (Ni), gold (Au), or palladium (Pd), and may be, e.g., a multilayer structure of Ni and Pd. The second metal layer 142 is formed in an anode recess formed in a portion of the semiconductor layer stack 102 opposite to the cathode electrode 103 with respect to the third nitride semiconductor layer 143, and is in ohmic contact with the channel. The second metal layer 142 may be, e.g., an alloy of Ti and Al.

In the diode of this embodiment, the anode electrode 104 includes the p-type third nitride semiconductor layer 143, the first metal layer 141 being in ohmic contact with the third nitride semiconductor layer 143, and the second metal layer 142 connected to the first metal layer 141, and being in ohmic contact with the channel. Since the second metal layer 142 is in ohmic contact with the channel, application of a forward bias to the anode electrode 104 can provide very low on-resistance. In contrast, application of a reverse bias to the anode electrode 104 allows a depletion layer to extend from the p-type third nitride semiconductor layer 143 to the semiconductor layer stack 102 immediately below the third nitride semiconductor layer 143. Thus, the channel is constricted to interrupt current from the cathode electrode 103 to the anode electrode 104. A leakage path formed between the protection film 106 and the semiconductor layer stack 102 is interrupted by the p-type third nitride semiconductor layer 143. This allows the reverse leakage current generated with the formation of the passivation film to be very small. The leakage current of the diode including the protection film can be about four orders of magnitude lower than that of a usual Schottky diode in which an anode electrode being a Schottky electrode and a cathode electrode being an ohmic electrode are formed on an AlGaN/GaN heterostructure. Furthermore, the reverse leakage current can be reduced to a value which is substantially equal to or about an order of magnitude lower than that of a Schottky diode before the formation of a protection film.

Figure 2:
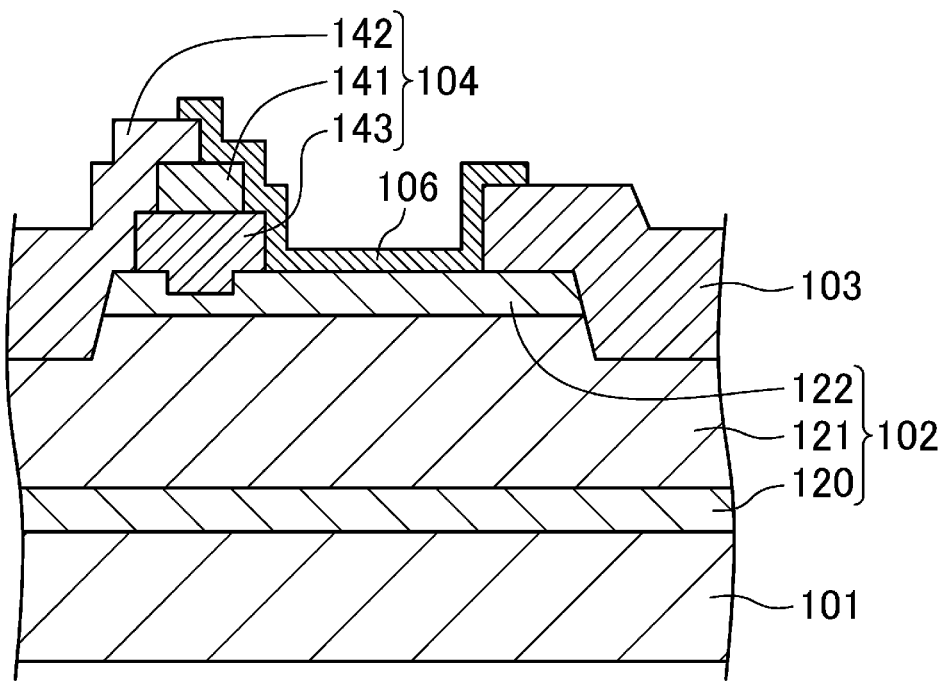
FIG. 2 is a cross-sectional view illustrating one variation of the diode according to the embodiment.

The forward threshold voltage across the diode of this embodiment depends on, e.g., the impurity concentration in the p-type third nitride semiconductor layer 143 and the thickness of a portion of the second nitride semiconductor layer 122 immediately below the third nitride semiconductor layer 143. For example, with a reduction in the thickness of the portion of the second nitride semiconductor layer 122 immediately below the third nitride semiconductor layer 143, the forward threshold voltage can be reduced, and with an increase in the thickness, the forward threshold voltage can be increased. Therefore, as illustrated in FIG. 2, when a recess is formed in the second nitride semiconductor layer 122, and the third nitride semiconductor layer 143 is formed to fill the recess, the forward threshold voltage can be reduced to achieve a diode providing lower conduction loss. Furthermore, the forward threshold voltage can be adjusted by adjusting the depth of the recess.

The diode of this embodiment can be operated in a situation where the voltage applied to the anode is about 1.5 V, i.e., a voltage which is lower than the voltage at which holes are injected from the p-type third nitride semiconductor layer 143 into the semiconductor layer stack 102. In this case, the p-type third nitride semiconductor layer 143 is not related to the forward bias operation of the diode. Therefore, the recovery time occurring when the diode is transitioned from a forward bias to a reverse bias is short, and the diode provides excellent recovery characteristics.

Figure 3:
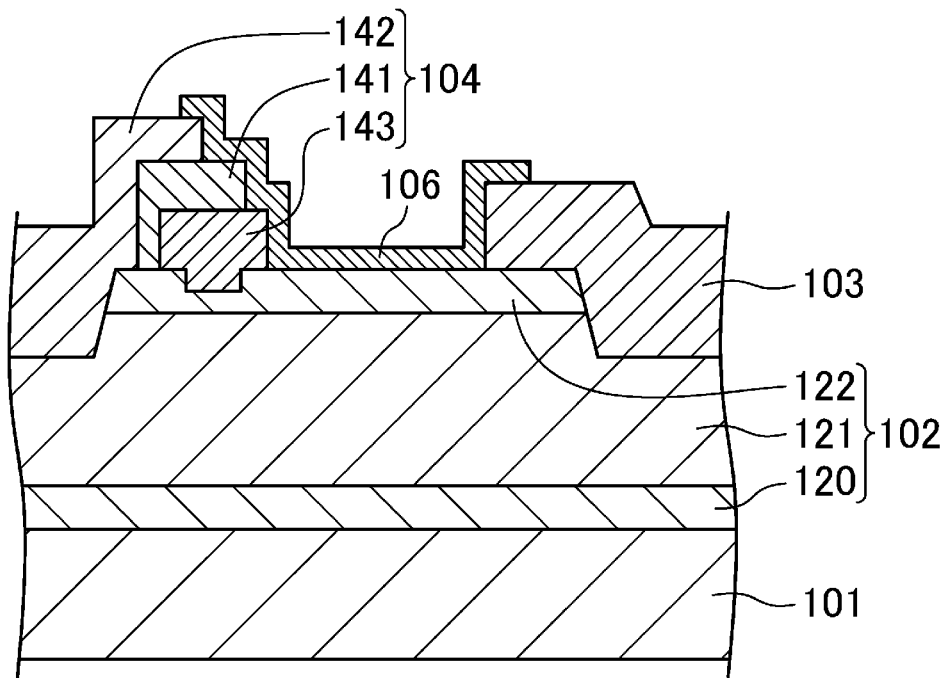
FIG. 3 is a cross-sectional view illustrating another variation of the diode according to the embodiment.

As illustrated in FIG. 3, the first metal layer 141 may be formed not only on the third nitride semiconductor layer 143, but also directly on the second nitride semiconductor layer 122. When the first metal layer 141 is to be formed only on the third nitride semiconductor layer 143, accurate alignment, for example, is required; however, with such a configuration as illustrated in FIG. 3, a large margin for forming a first metal layer 141 can be ensured. The resistance between the second metal layer 142 and the first metal layer 141 can be also reduced.

Figure 4:
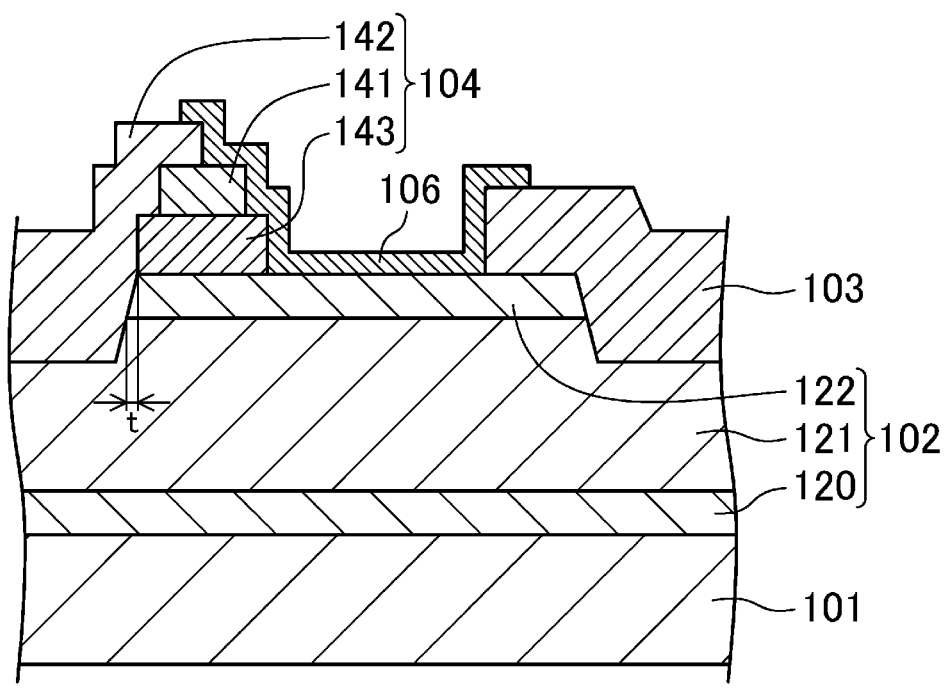
FIG. 4 is a cross-sectional view illustrating still another variation of the diode according to the embodiment.

The second metal layer 142 may be electrically connected to the first metal layer 141, and the second metal layer 142 opposite to the cathode electrode 103 with respect to the third nitride semiconductor layer 143 may be in ohmic contact with the channel. The smaller the distance between the location at which the second metal layer 142 is in contact with the channel and an end of the third nitride semiconductor layer 143 opposite to the cathode electrode 103, the on-resistance and size of the diode can be reduced. Thus, as illustrated in FIG. 4, the anode recess is preferably formed so as to be aligned with the location of the end of the third nitride semiconductor layer 143 opposite to the cathode electrode 103, and the distance t between the location at which the second metal layer 142 is in contact with the channel and the end of the third nitride semiconductor layer 143 opposite to the cathode electrode 103 is preferably minimized. Actually, when an anode recess is formed, the anode recess is slightly tapered, and thus, although the distance t cannot be exactly zero, it can be substantially zero, resulting in a reduction in the on-resistance.

Figure 5:
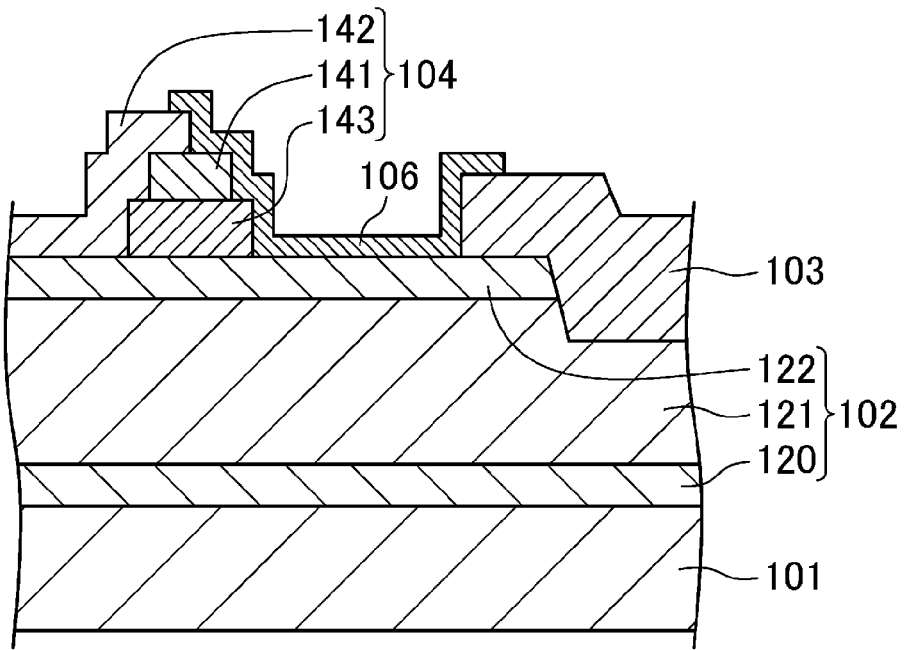
FIG. 5 is a cross-sectional view illustrating yet another variation of the diode according to the embodiment.

In this embodiment, the configuration in which the anode recess extending below the interface between the first and second nitride semiconductor layers 121 and 122 is formed to bring the second metal layer 142 in direct ohmic contact with the channel was described. However, the second metal layer 142 merely needs to be in ohmic contact with the channel, and as illustrated in FIG. 5, the second metal layer 142 may be formed on the second nitride semiconductor layer 122. Like the second metal layer 142, the cathode electrode 103 may be also formed on the second nitride semiconductor layer 122. When the second metal layer 142 or the cathode electrode 103 is to be formed on the second nitride semiconductor layer 122, n-type impurities, such as Si, may be implanted into a portion of the semiconductor layer stack 102 immediately below the second metal layer 142 or the cathode electrode 103. This can improve the ohmic performance of the contact between the second metal layer 142 or the cathode electrode 103 and the channel.

Figure 6:
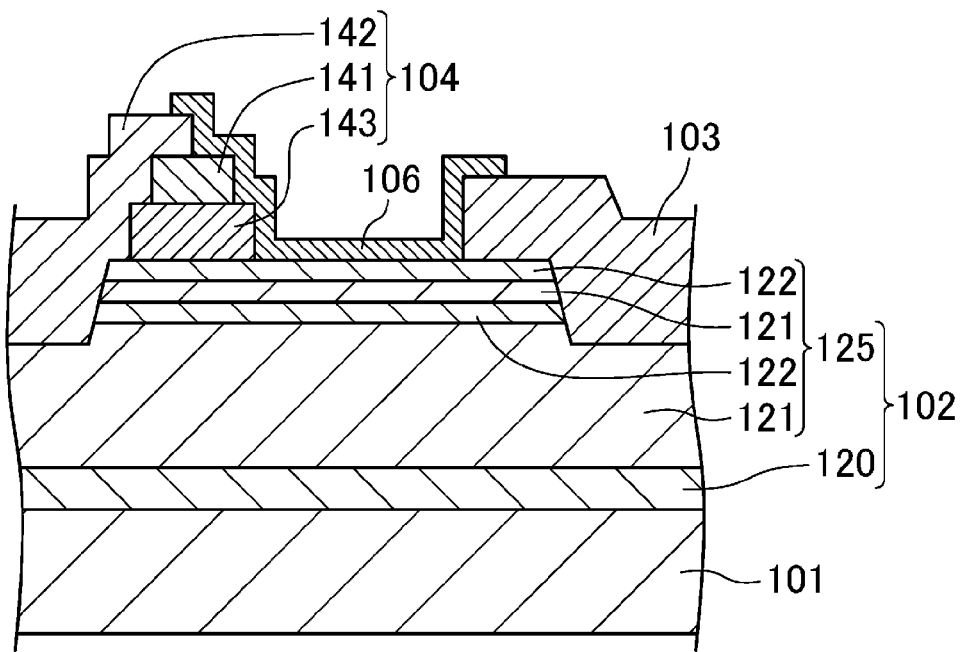
FIG. 6 is a cross-sectional view illustrating a further variation of the diode according to the embodiment.

In order to further reduce the on-resistance, as illustrated in FIG. 6, the semiconductor layer stack 102 may include a multi-channel layer 125 obtained by alternately stacking first nitride semiconductor layers 121 made of i-GaN, and second nitride semiconductor layers 122 made of i-AlGaN. When the multi-channel layer 125 is formed, 2DEG forming channels is generated in a portion of each of the first nitride semiconductor layers 121 in the vicinity of the interface between the first nitride semiconductor layer 121 and each of the adjacent second nitride semiconductor layers 122. Since the number of the channels is two or more, the on-resistance can be significantly reduced.

FIG. 6 illustrates an example in which the multi-channel layer 125 includes two groups each including one of the first nitride semiconductor layers 121 and one of the second nitride semiconductor layers 122; however, the number of the groups each including the first nitride semiconductor layer 121 and the second nitride semiconductor layer 122 may be three or more. With an increase in the number of the groups each including the first nitride semiconductor layer 121 and the second nitride semiconductor layer 122, the on-resistance can be reduced; however, when the number of the groups is too large, it becomes difficult to form the groups. About 20 or less groups can be formed without any problem. The thickness of each of one or more of the first nitride semiconductor layers 121 other than the lowest first nitride semiconductor layer 121 may be about 20-80 nm. The thickness of each of the second nitride semiconductor layers 122 may be about 10-30 nm.

Figure 7:
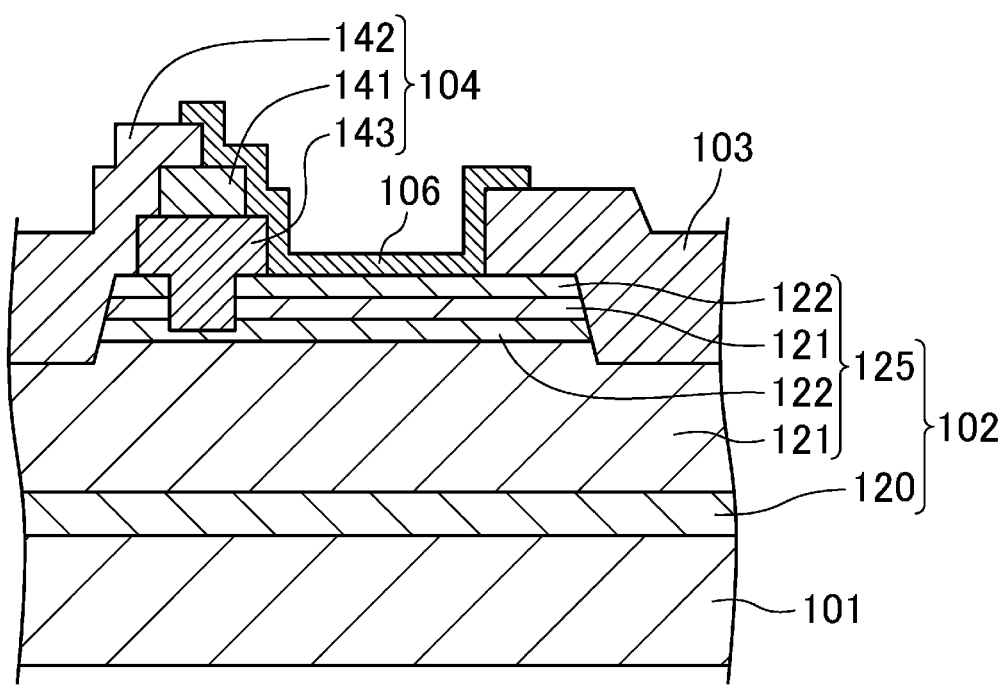
FIG. 7 is a cross-sectional view illustrating a still further variation of the diode according to the embodiment.

Also when the multi-channel layer 125 is used, the third nitride semiconductor layer 143 may be formed in a recess. In this case, as illustrated in FIG. 7, a recess may be formed so as not to reach the interface between the lowest second nitride semiconductor layer 122 and the lowest first nitride semiconductor layer 121. The recess does not always need to reach the lowest second nitride semiconductor layer 122, and the depth of the recess may be adjusted depending on the required forward threshold voltage.

In order to reduce the on-resistance, while the recesses for forming the second metal layer 142 and the cathode electrode 103 preferably extend below the interface between the lowest second nitride semiconductor layer 122 and the lowest first nitride semiconductor layer 121, they do not need to extend below the interface. The second metal layer 142 and the cathode electrode 103 may be formed on the uppermost second nitride semiconductor layer 122. In this case, impurities, such as Si, may be implanted into portions of the semiconductor layer stack 102 under the second metal layer 142 and the cathode electrode 103 to facilitate providing ohmic contact between each of the second metal layer 142 and the cathode electrode 103 and the channel.

An example in which the first nitride semiconductor layer or layers 121 are GaN layers, and the second nitride semiconductor layer or layers 122 are AlGaN layers was described; however, when the band gap of the second nitride semiconductor layer 122 is larger than that of the first nitride semiconductor layer 121, nitride semiconductor layers having an optional composition represented by $Al_xGa_{1-x-y}In_yN$ (where $0 \le x \le 1$, $0 \le y \le 1$, and $0 \le x+y \le 1$) can be used in combination. When the multi-channel layer 125 is formed, all of the first nitride semiconductor layers 121 do not need to have an identical composition, and all of the second nitride semiconductor layers 122 do not need to have an identical composition. As long as the third nitride semiconductor layer 143 is p-type, it may have an optional composition represented by $Al_xGa_{1-x}N$ (where $0 \le x < 1$). The concentration of p-type impurities contained in the third nitride semiconductor layer 143 may be also appropriately changed. The protection film 106 may be made of, e.g., an AlN film instead of the SiN film.

Each of the drawings illustrates a principal arrangement of the cathode electrode and the anode electrode. The arrangement is not limited to the above arrangement; cathode electrodes may be formed laterally outward of an anode electrode, and alternatively, a cathode electrode may be formed to surround an anode electrode. For example, an anode electrode may be formed in a circular shape, and the cathode electrode may be formed in a ring shape to surround the anode electrode. Alternatively, the anode electrode may be replaced by the cathode electrode, and thus, the anode electrode may be disposed to surround the cathode electrode.

The present disclosure provides diodes which are made of a nitride semiconductor, and which can implement a sufficiently reduced reverse leakage current even with the formation of a passivation film. The diodes are useful, in particular, as power devices which can be used in, e.g., power supply circuits in consumer apparatuses including a television set.

The invention claimed is:

1. A diode comprising:
   a nitride semiconductor layer structure formed on a principal surface of a substrate, having a channel, and including an undoped nitride layer or an n-type nitride layer; and
   cathode and anode electrodes formed on the nitride semiconductor layer structure so as to be spaced apart from each other, wherein
   the anode electrode includes:
      a p-type nitride semiconductor layer formed on the nitride semiconductor layer structure;
      a first metal layer formed on an upper surface of the p-type nitride semiconductor layer, and being in ohmic contact with the p-type nitride semiconductor layer;
      a second metal layer being in contact with the first metal layer, being opposite to the cathode electrode with respect to the p-type nitride semiconductor layer, and being in ohmic contact with the channel, and
   the second metal layer being in direct contact with the channel.

2. The diode of claim 1, wherein
   the nitride semiconductor layer structure includes a plurality of first nitride semiconductor layers, and a plurality of second nitride semiconductor layers which are each formed on one of the first nitride semiconductor layers, and each have a larger band gap than the first nitride semiconductor layers, and
   the first nitride semiconductor layers and the second nitride semiconductor layers are alternately formed.

3. The diode of claim 2, wherein
   the nitride semiconductor layer structure has a recess which does not reach an interface between a lowest one of the first nitride semiconductor layers, and a lowest one of the second nitride semiconductor layers, and
   the p-type nitride semiconductor layer is formed to fill the recess.

4. The diode of claim 3, wherein the recess reaches the lowest second nitride semiconductor layer.

5. The diode of claim 2, wherein
   the nitride semiconductor layer structure has an anode recess passing through the second nitride semiconductor layer, and extending below an interface between the first and second nitride semiconductor layers.

6. The diode of claim 5, wherein a location at which the second metal layer is in contact with the channel is substantially aligned with a location of an end of the p-type nitride semiconductor layer opposite to the cathode electrode.

7. The diode of claim 2, wherein
   the second nitride semiconductor layer has a recess which does not reach the first nitride semiconductor layer, and
   the p-type nitride semiconductor layer is formed to fill the recess.

8. The diode of claim 1, wherein the p-type nitride semiconductor layer is made of $Al_xGa_{1-x}N$, where $0 \le x < 1$.

9. The diode of claim 1, wherein
   the first metal layer is made of a material containing nickel or palladium, and
   the second metal layer is made of a material containing aluminum or titanium.

10. The diode of claim 1, wherein electrons travel through the channel in a direction parallel to the principal surface of the substrate.

11. The diode of claim 1, further comprising:
    a protection film covering a region of an upper surface of the nitride semiconductor layer structure between the cathode and anode electrodes.

12. The diode of claim 1, wherein the first metal layer is wholly disposed on an upper surface of the p-type nitride semiconductor layer.

13. The diode of claim 1, wherein the second metal layer is in direct contact with an upper surface and a side surface of the first metal layer, and in direct contact with a side surface of the p-type nitride semiconductor layer.

14. The diode of claim 1, wherein the second metal layer is in direct contact with a side surface of the channel.

* * * * *